(12) United States Patent
Weber

(10) Patent No.: US 7,725,160 B2
(45) Date of Patent: May 25, 2010

(54) TUNABLE MRI ENHANCING DEVICE

(75) Inventor: Jan Weber, Maple Grove, MN (US)

(73) Assignee: Boston Scientific Scimed, Inc., Maple Grove, MN (US)

( * ) Notice: Subject to any disclaimer, the term of this patent is extended or adjusted under 35 U.S.C. 154(b) by 1612 days.

(21) Appl. No.: 10/216,988

(22) Filed: Aug. 12, 2002

(65) Prior Publication Data
US 2004/0030242 A1 Feb. 12, 2004

(51) Int. Cl.
*A61B 5/05* (2006.01)
(52) U.S. Cl. .................. 600/423; 600/422; 324/313
(58) Field of Classification Search .......... 600/421–423; 604/526; 606/300, 194; 324/300, 313, 314, 324/322
See application file for complete search history.

(56) References Cited

U.S. PATENT DOCUMENTS

| | | | |
|---|---|---|---|
| 4,856,530 A | 8/1989 | Vandervelden | 128/692 |
| 5,050,607 A * | 9/1991 | Bradley et al. | 600/423 |
| 5,170,789 A | 12/1992 | Narayan et al. | 128/653.5 |
| 5,323,778 A * | 6/1994 | Kandarpa et al. | 600/411 |
| 5,394,087 A * | 2/1995 | Molyneaux | 324/318 |
| 5,442,369 A * | 8/1995 | Van Voorhies et al. | 343/742 |
| 5,476,095 A | 12/1995 | Schnall et al. | 128/653.2 |
| 5,481,191 A * | 1/1996 | Rzedzian | 324/318 |
| 5,699,801 A | 12/1997 | Atalar et al. | 128/653.2 |
| 5,848,964 A * | 12/1998 | Samuels | 600/200 |
| 6,179,858 B1 | 1/2001 | Squire et al. | 606/198 |
| 6,236,205 B1 | 5/2001 | Ludeke et al. | 324/318 |
| 6,263,229 B1 | 7/2001 | Atalar et al. | 600/423 |
| 6,280,385 B1 | 8/2001 | Melzer et al. | 600/423 |
| 6,425,909 B1 * | 7/2002 | Dieck et al. | 606/200 |
| 6,436,120 B1 * | 8/2002 | Meglin | 606/200 |
| 6,633,161 B1 * | 10/2003 | Vaughan, Jr. | 324/318 |
| 6,847,837 B1 * | 1/2005 | Melzer et al. | 600/421 |
| 2002/0050819 A1 | 5/2002 | Minkoff et al. | 324/318 |

FOREIGN PATENT DOCUMENTS

| | | |
|---|---|---|
| EP | 0 768 539 A2 | 4/1997 |
| EP | 1 092 985 A2 | 4/2001 |
| JP | 8-327715 | 12/1996 |
| WO | WO 01/32254 A1 | 5/2001 |
| WO | WO 01/75466 A1 | 10/2001 |

OTHER PUBLICATIONS

Debvatin J.F., Adam G. Interventional Magnetic Resonance Imaging: 1998 Springer, Berlin Heidelberg Chapter 34. Intravascular MRI by G.G. Zimmerman et al. pp. 283-293.
Berry L. et al. Development of Implantable Detection Microlcoils for Minimally Invasive NMR Spectroscopy: Sensors and Actuators A, Elsevier Sequoia S.A., Lausanne, CH vol. 93, No. 3, Oct. 15, 2001 p. 214-218.
Patent Abstract of Japan, Publication No. 08327715, Publication Date Dec. 13, 1996, Applicant Nippon Telegr & Teleph Corp., 1996.

* cited by examiner

*Primary Examiner*—Eric F Winakur
*Assistant Examiner*—Ellsworth Weatherby
(74) *Attorney, Agent, or Firm*—Brooks, Cameron & Huebsch, PLLC

(57) ABSTRACT

The present invention is directed to an MRI enhancing device deployable in a body. In one embodiment, the MRI enhancing device is formed of a wire loop and a capacitor that is at least partially formed by the wire used in forming the wire loop.

30 Claims, 5 Drawing Sheets

FIG._1

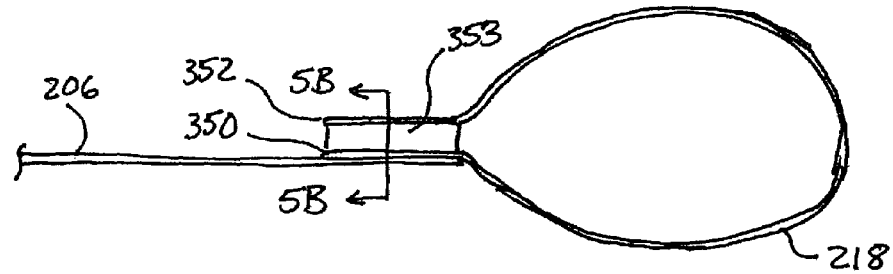
FIG. 5A
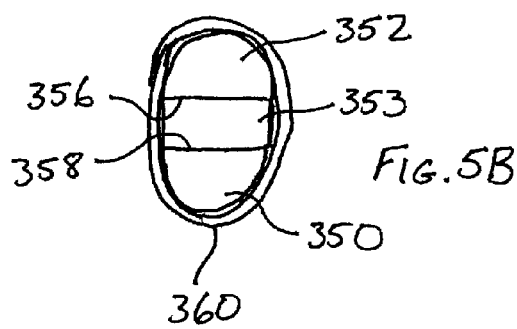
FIG. 5B
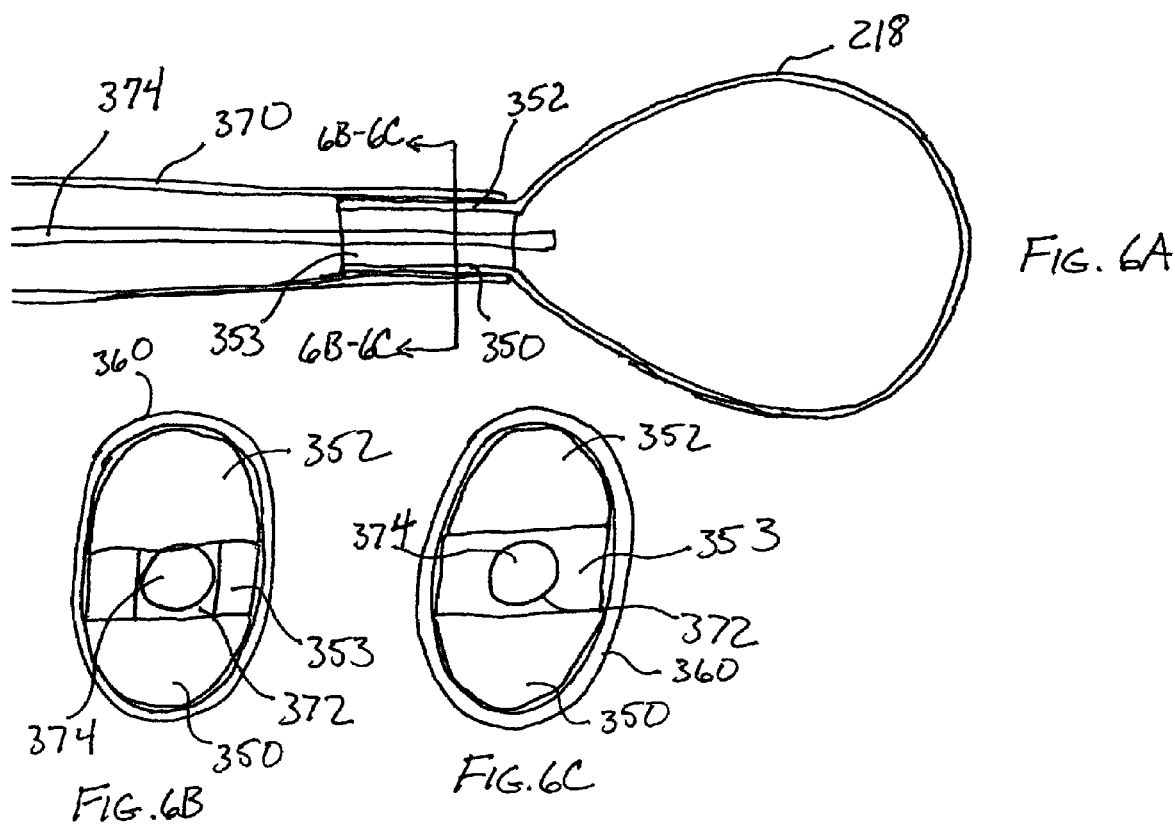
FIG. 6A
FIG. 6B
FIG. 6C

TUNABLE MRI ENHANCING DEVICE

REFERENCE TO COPENDING APPLICATION

Reference is made to the following related application: IMPEDANCE-MATCHING APPARATUS AND CONSTRUCTION FOR INTRAVASCULAR DEVICE, filed Nov. 13, 2001, Ser. No. 10/008,380 and assigned the same assignee as the present invention.

BACKGROUND OF THE INVENTION

The present invention relates generally to intravascular devices. More particularly, the present invention relates to tunable MRI enhancing devices, such as filters and balloon catheters.

Tracking of catheters and other devices positioned within a body may be achieved by means of a magnetic resonance imaging (MRI) system. Typically, such a magnetic resonance imaging system may be comprised of a magnet, a pulsed magnetic field gradient generator, a transmitter for transmitting electromagnetic waves in radio frequency (RF), a radio frequency receiver, and a controller. In a common implementation, an antenna is disposed either on the device to be tracked or on a guidewire or catheter (commonly referred to as an MR catheter) used to assist in the delivery of the device to its destination. In one known implementation, the antenna comprises an electrically conductive coil that is coupled to a pair of elongated electrical conductors that are electrically insulated from each other and that together comprise a transmission line adapted to transmit the detected signal to the RF receiver.

In one embodiment, the coil is arranged in a solenoid configuration. The patient is placed into or proximate the magnet and the device is inserted into the patient. The magnetic resonance imaging system generates electromagnetic waves in radio frequency and magnetic field gradient pulses that are transmitted into the patient and that induce a resonant response signal from selected nuclear spins within the patient. This response signal induces current in the coil of electrically conductive wire attached to the device. The coil thus detects the nuclear spins in the vicinity of the coil. The transmission line transmits the detected response signal to the radio frequency receiver, which processes it and then stores it with the controller. This is repeated in three orthogonal directions. The gradients cause the frequency of the detected signal to be directly proportional to the position of the radio-frequency coil along each applied gradient.

The position of the radio frequency coil inside the patient may therefore be calculated by processing the data using Fourier transformations so that a positional picture of the coil is achieved. In one implementation this positional picture is superposed with a magnetic resonance image of the region of interest. This picture of the region may be taken and stored at the same time as the positional picture or at any earlier time.

In a coil-type antenna such as that described above, it is desirable that the impedance of the antenna coil substantially match the impedance of the transmission line. In traditional impedance matching of MRI coils, shunt-series or series shunt capacitor combinations suffice to tune the coil. In such traditional applications, the capacitors almost never pose a size constraint. However, for intravascular coils, miniaturization of the tuning capacitors is necessary.

Discrete components have been employed to construct matching and tuning circuits on intravascular devices. Such components are bulky and are not easily incorporated into the design of the device. Also, placement of the tuning capacitors away from the coil without a reduction in the signal-to-noise ratio (SNR) is desirable. It has been proposed to use open circuit stub transmission lines as a means of fabricating arbitrary or trimmable capacitors and to use short-circuited stubs as tuning inductors. Such probes are tuned by trimming the length of the coaxial cables. However, these circuits still result in a relatively large device that is not ideal for intravascular navigation.

Also, in the past, an active MRI self-expanding stent design has been developed. In this design, a surface mountable capacitor was mounted to a stent to produce an LC circuit using the stent as a coil. However, in order to match the resonating frequency of the circuit to the Larmor frequency, the surface mount capacitor had to be tuned prior to implementation. The resonant frequency of such a circuit depends on the diameter of the expanded stent, and is thus not known prior to implementation. Therefore, any tuning procedure prior to implementation carries the risk of mis-tuning. Also, as discussed above, the addition of a surface mount capacitor increases the thickness of the stent.

SUMMARY OF THE INVENTION

The present invention is directed to an MRI enhancing device deployable in a body. In one embodiment, the MRI enhancing device is formed of a wire loop and a capacitor that is at least partially formed by the wire used in forming the wire loop.

In another embodiment, the resonant frequency is tunable even when the device is deployed in the body. This can be done using a dielectric material that can be selectively moved between plates of the capacitor to change the capacitance.

The invention can be implemented in a variety of devices, such as balloon catheters and filters, for example.

BRIEF DESCRIPTION OF THE DRAWINGS

FIGS. 5A and 5B illustrate a distal protection filter in conjunction with a guidewire formed as an LC circuit.

FIGS. 6A-6C illustrate another embodiment of a distal protection filter employed as an LC circuit for enhancing MRI signals.

DETAILED DESCRIPTION OF THE ILLUSTRATIVE EMBODIMENTS

Figure 1:
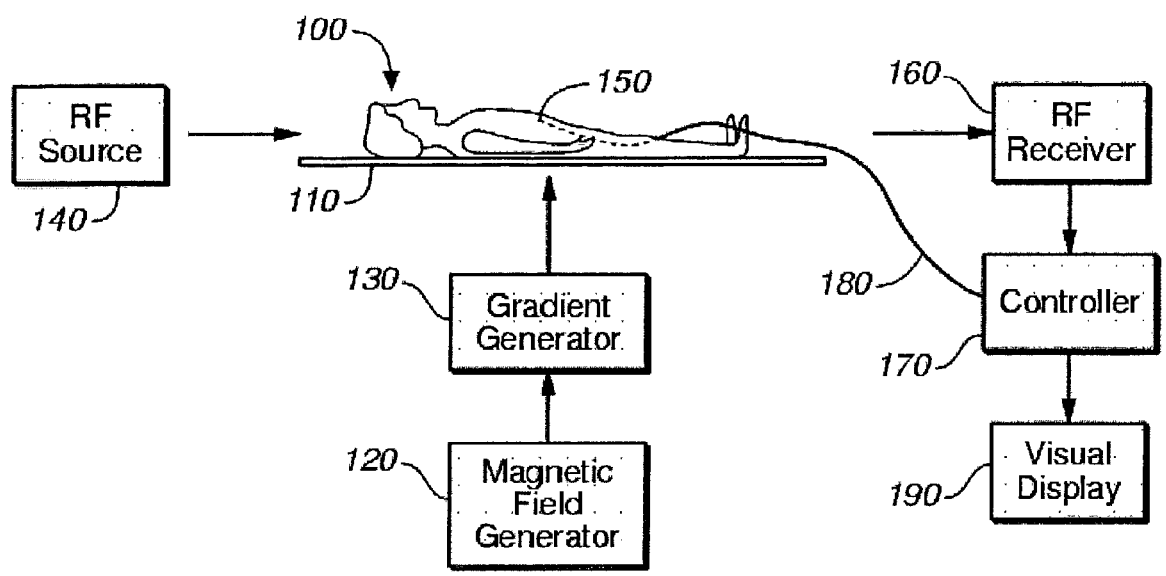
FIG. 1 is a partial block diagram of an illustrative magnetic resonance imaging and intravascular guidance system in which embodiments of the present invention can be employed.

FIG. 1 is a partial block diagram of an illustrative magnetic resonance imaging and intravascular guidance system in which embodiments of the present invention could be employed. In FIG. 1, subject 100 on support table 110 is placed in a homogeneous magnetic field generated by magnetic field generator 120. Magnetic field generator 120 typically comprises a cylindrical magnet adapted to receive subject 100. Magnetic field gradient generator 130 creates magnetic field gradients of predetermined strength in three mutually orthogonal directions at predetermined times. Magnetic field gradient generator 130 is illustratively comprised of a set of cylindrical coils concentrically positioned within magnetic field generator 120. A region of subject 100 into which a device 150, shown as a catheter, is inserted, is located in the approximate center of the bore of magnet 120.

RF source 140 radiates pulsed radio frequency energy into subject 100 and the MR active sample within device 150 at predetermined times and with sufficient power at a predetermined frequency to nutate nuclear magnetic spins in a fashion well known to those skilled in the art. The nutation of the spins causes them to resonate at the Larmor frequency. The Larmor frequency for each spin is directly proportional to the strength of the magnetic field experienced by the spin. This field strength is the sum of the static magnetic field generated by magnetic field generator 120 and the local field generated by magnetic field gradient generator 130. In an illustrative embodiment, RF source 140 is a cylindrical external coil that surrounds the region of interest of subject 100. Such an external coil can have a diameter sufficient to encompass the entire subject 100. Other geometries, such as smaller cylinders specifically designed for imaging the head or an extremity can be used instead. Non-cylindrical external coils such as surface coils may alternatively be used.

Device 150 is inserted into subject 100 by an operator. Device 150 may be a guide wire, a catheter, a filter, an ablation device or a similar recanalization or other device. Device 150 includes an RF antenna which detects MR signals generated in both the subject and the device 150 itself in response to the radio frequency field created by RF source 140. Since the internal device antenna is small, the region of sensitivity is also small. Consequently, the detected signals have Larmor frequencies which arise only from the strength of the magnetic field in the proximate vicinity of the antenna. The signals detected by the device antenna are sent to imaging and tracking controller unit 170 via conductor 180.

External RF receiver 160 also detects RF signals emitted by the subject in response to the radio frequency field created by RF source 140. In an illustrative embodiment, external RF receiver 160 is a cylindrical external coil that surrounds the region of interest of subject 100. Such an external coil can have a diameter sufficient to encompass the entire subject 100. Other geometries, such as smaller cylinders specifically designed for imaging the head or an extremity can be used instead. Non-cylindrical external coils, such as surface coils, may alternatively be used.

External RF receiver 160 can share some or all of its structure with RF source 140 or can have a structure entirely independent of RF source 140. The region of sensitivity of RF receiver 160 is larger than that of the device antenna and can encompass the entire subject 100 or a specific region of subject 100. However, the resolution which can be obtained from external RF receiver 160 is less than that which can be achieved with the device antenna. The RF signals detected by external RF receiver 160 are sent to imaging and tracking controller unit 170 where they are analyzed together with the RF signals detected by the device antenna.

The position of device 150 is determined in imaging and tracking controller unit 170 and is displayed on display means 180. In an illustrative embodiment, the position of device 150 is displayed on display means 180 by superposition of a graphic symbol on a conventional MR image obtained by external RF receiver 160. Alternatively, images may be acquired with external RF receiver 160 prior to initiating tracking and a symbol representing the location of the tracked device can be superimposed on the previously acquired image. Alternative embodiments of the invention display the position of the device numerically or as a graphic symbol without reference to a diagnostic image.

When performing MRI, tuning the resonant frequency of an implanted antenna (or coil) to the Larmor frequency of the surrounding protons enhances their MR visibility. Using a receiver coil outside the body, as illustrated with respect to 160 in FIG. 1, the resonating circuit inside the body induces currents in the receiver coil 160 outside the body, and by this configuration, the MR signal from the area directly surrounding the implanted device can be enhanced. This is better illustrated with respect to FIG. 2.

Figure 2:
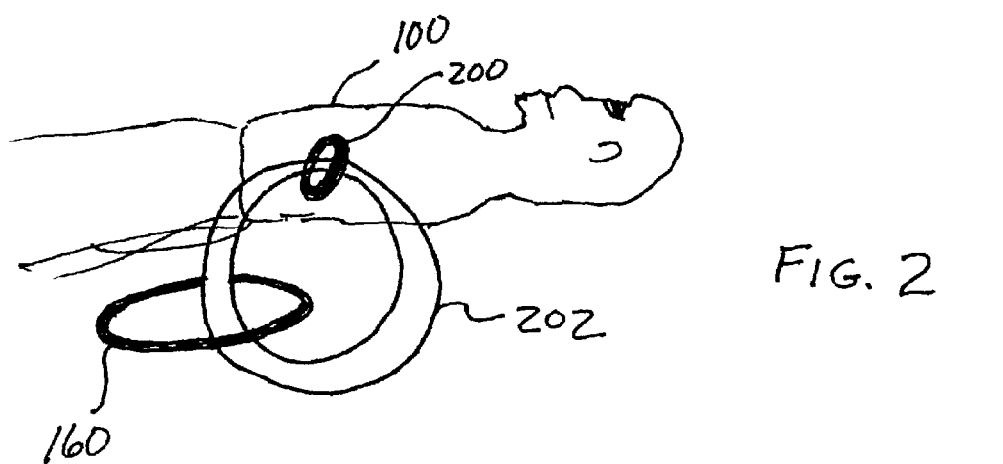
FIG. 2 is a schematic illustration of a system for enhancing an MRI signal.

As shown in FIG. 2, coil 200 is implanted within subject 100. Receiver coil 160 resides outside of subject 100. The magnetic field lines (shown generally at 202) of implanted coil 200 pass through receiver coil 160 positioned outside of subject 100. Of course, as discussed above, receiver coil 160 is connected to further electronics to enable visualization. Thus, resonant coil 200 induces currents in receiver coil 160 which enhance the MR signal in the area directly surrounding coil 200. As discussed above, it is desirable to match the resonating frequency of the resonant coil 200 to the Larmor frequency (63.6 Megahertz at 1.5 Tesla, or 42.4 Megahertz per Tesla).

Figure 3:
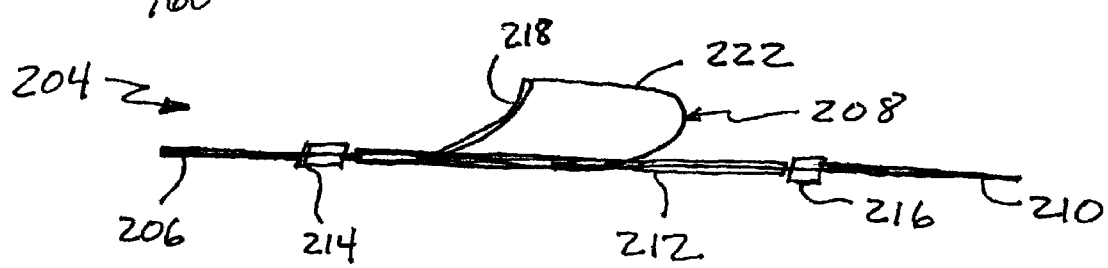
FIGS. 3 and 4 illustrate portions of an intravascular distal protection filter.
Figure 4:
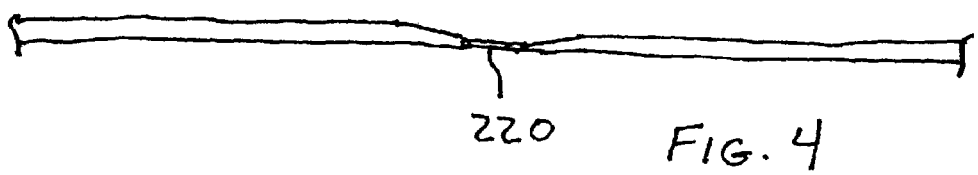

FIGS. 3 and 4 illustrate portions of a known distal vascular protection filter 204. It can be seen that filter 204 is deployed by a core guidewire 206 that is attached to a filter portion 208 and includes a radioopaque tip 210. The filter 208 is carried on guidewire 214 such that it can be advanced distal of a lesion or obstruction in a patient's vessel. To be delivered, filter 208 is illustratively placed within a delivery catheter in a radially collapsed insertion position and advanced distal of the obstruction or lesion. Once the tip of the delivery catheter is past the lesion, filter 204 is removed from the delivery catheter such that filter 208 expands in the vessel.

In one embodiment, filter 208 is mounted on a hypotube or sleeve 212 and is positioned between a proximal stop 214 and a distal stop 216. Stops 214 and 216 may be sufficiently close to one another and to sleeve 212 such that filter 208 has very little perceptible longitudinal movement over guidewire 206. However, stops 214 and 216 allow guidewire 206 to be rotated within sleeve 212 without disturbing the position of filter 208.

FIG. 3 also illustrates that the proximal facing end of filter 208 is connected to a resilient loop 218, such as a Nitinol loop, which forms a proximally facing mouth of filter 208. Loop 218 can be slightly proximally sloping and include an articulation region (shown at 220 in FIG. 4) that is a thinned area of the wire forming loop 218. This allows loop 218 to collapse and fit within the delivery catheter.

A filter sac 222 is also connected to the resilient loop 218. Sac 222 may illustratively have a number of perforations at its distal end to allow blood or other liquids to pass through the filter sac while capturing any debris that may be dislodged in the vessel.

Sac 222 is illustratively formed of a polymer membrane that is connected to loop 218 and guidewire 206 (or to a hypotube or sleeve 212) by either laser welding, soldering, adhesive, or another suitable connection mechanism.

For removal, a removal catheter (which may be the same as the delivery catheter) is illustratively advanced over guidewire 206 and filter 208 is drawn within the removal catheter. For example, pulling the filter 208 toward the distal end of the removal catheter will illustratively cause loop 218 to collapse. As the filter sac 222 and loop 218 are collapsed, the debris within the filter is illustratively captured within sac 222 and the removal catheter.

As discussed above, it is becoming standard procedure to place a filter device, such as that shown in FIGS. 3 and 4, distal to a lesion during an angioplasty procedure (or other similar procedure) in order to capture loose particles. It can be seen from FIG. 3 that the shape of resilient loop 218 lends itself to act as a resonant coil in magnetic resonance imaging.

For effective implementation of such a resonating coil, the self-inductance of the coil must be calculated, and a capacitor must be connected to the circuit to create a resonance at the Larmor frequency. The self-inductance of a circular loop of round wire is:

$$L = \mu_0 a(\ln(8a/R) - 1.75) \quad \text{Eq. 1}$$

Where $\mu_0 = 4\pi \, 10^{-7}$ H/m.
R = the radius of the wire; and
a = the radius of the loop.

In accordance with one embodiment, "a" is between approximately 1.75 and 2.75 millimeter and the diameter of the round wire used (2R) is 40 micrometers. Thus, using equation 1, the self-inductance L is $1.056e^{-8}$H which equals 10.5 nH. For a larger size filter, with a=2.75, the self-inductance L=18 nH.

Next, the capacitance of the capacitor used in the resonating circuit must be determined. The resonating frequency of an LC circuit is:

$$f_{resonant} = \left(\frac{1}{2\pi}\right)\left(\frac{1}{LC}\right)^{-\frac{1}{2}} \quad \text{Eq. 2}$$

Since the Larmor frequency for a 1.5 T MR tube is 63.6 MHz, the capacitance C must be 0.60 nF (1.34 nF for 1.0 Tesla).

In order to minimize the dimension of the capacitor, a material having a very high dielectric constant $\in_r$ may be desired because the capacitance is directly related to $\in_r$.

In general, dielectric materials are insulators used for their exceptional dielectric properties. When a material is introduced between two plates of a capacitor, the total charge stored in the capacitor changes. The change depends on the ability of the material to polarize under an electric field. The dielectric constant, or permitivity, of a material determines the change in charge storage. For high capacity applications, a high dielectric constant is desirable. Since the dielectric constant depends on the polarization in the material, Ferroelectric materials may be desirable. High dielectric constant materials are also referred to as high K materials. A high permitivity piezoelectric ceramic is referred to under the designation TRSHK1, which has been developed specifically for biomedical ultrasound applications by TRS ceramics (of the State College of Pennsylvania) such material has a dielectric constant exceeding 6,000. Of course, other materials can be used as well.

For a simple plate capacitor, the capacitance is calculated as follows:

$$C = \in_r \cdot \in_0 \cdot A/d \quad \text{Eq. 3}$$

Where $\in_0 = 8.855 \times 10^{-12}$;
A = the area of the plates of the capacitor;
d = the distance between the plates; and
$\in_r$ = the dielectric constants of the material between the plates (where dimensions are in meters).

FIGS. 5A and 5B illustrate one embodiment of implementing an MR enhancing LC circuit in a filter such as that shown in FIGS. 3 and 4. FIG. 5A illustrates core wire 206 connected to loop 218 as shown in FIG. 3. However, instead of welding loop 218 to guidewire 206 to form the loop, only one end 350 of loop 218 is directly connected to guidewire 206. The other end 352 of loop 218 is separated from end 350 by a ceramic (or other dielectric) material. Thus, ends 350 and 352 form two plates of a capacitor which result in an active electric circuit of a coil (loop 218) in series with the capacitance created by plates 350 and 352.

FIG. 5B illustrates one embodiment of forming the capacitor. The ends 350 and 352 of the wire forming loop 218 are ground to form the hemispherical shapes shown in FIG. 5B, with substantially flat surfaces 356 and 358 facing one another. The dielectric layer 353 is placed between the flattened faces 356 and 358.

In the exemplary embodiment discussed herein, the diameter of the wire (which can be Nitinol) forming loop 218 is 40 micrometers. By grinding away half of the wire at ends 350 and 352, this leaves a space between ends 350 and 352 of 40 micrometers. Thus, a flat piece of suitable dielectric material having a thickness of 40 micrometers is placed between the faces 356 and 358 of ends 350 and 352 of the wire. By making the length of ends 350 and 352 approximately 1.12 millimeters (0.044 inches) long, this results in a capacitor having a capacitance of 0.6 nF. In accordance with one embodiment, the capacitor is covered or surrounded by a non-conducting material 360 in order to create a mechanical bond.

As is known within MRI, standing RF waves can occur in long metallic sections resulting in heating effects. Therefore, it is desirable that guidewire 206 be formed of metallic sections which are less than 12 centimeters in length (a half wavelength) to avoid standing waves. Similarly, however, guidewire 206 can be formed of a non-conducting material such as glass, or a polymer, or any other suitable material.

The capacitor of this embodiment saves significant space over discrete capacitors in prior systems. The capacitance of the capacitor can be trimmed by simply starting with a long length of capacitor and removing pieces of it either by a grinding process, laser ablation, etc., until the resonance frequency matches the Larmor frequency. However, as discussed in the background section, it can be desirable to tune the resonance frequency of the circuit continuously while in the body within the MRI scanning system.

FIGS. 6A-6C illustrate one embodiment in which the circuit can be tuned within the body. FIGS. 6A-6C are similar to the embodiment shown in FIGS. 5A and 5B. However, instead of loop 218 simply being connected to a core wire, it is illustratively connected to a hypotube or sleeve 370. As shown in FIG. 6B, ends 350 and 352 are flattened to form a capacitor. Also, a dielectric material 353 is inserted between the plates of the capacitor.

However, as shown in FIG. 6B, an opening 372 is left between the plates of the capacitor in the region containing dielectric material 353. A dielectric wire 374 is illustratively slidably disposed in opening 372. Wire 374 illustratively extends proximally to a region where it is accessible by the user. Thus, wire 374 can be slidably moved within hypotube 370 and opening 372. By advancing or retracting wire 374 distally into or proximally out of opening 372 in the capacitor formed by ends 350 and 352, the capacitance of the capacitor can be changed because this action introduces more or less dielectric material (a greater or lesser length of wire 374) in between the capacitor plates. Of course, it may be desirable that the hypotube 370 be made out of sections of metal with polymer tube connectors, or that it simply be made out of a polymer material, again in order to avoid standing wave heating affects.

FIG. 6C is similar to FIG. 6B except that the opening 372 is just large enough for wire 374 to slide through. Thus, more dielectric material 353 is positioned between the plates of the capacitor.

Figure 7:
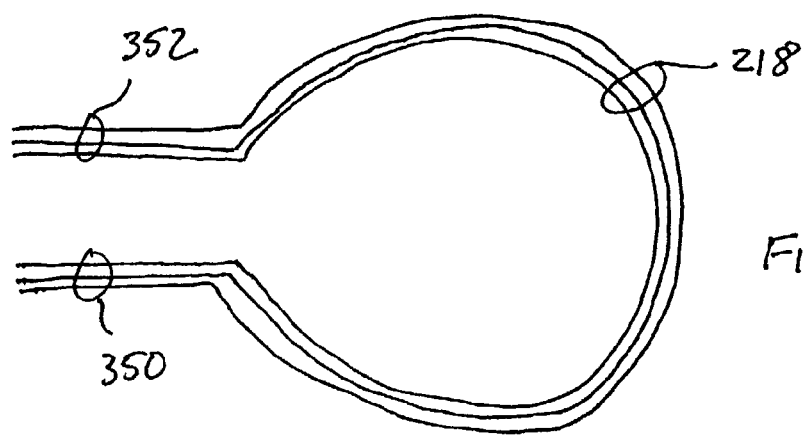
FIG. 7 is another embodiment of a coil.

A number of other embodiments are contemplated as well. For example, as shown in FIG. 7, instead of having a single wire loop 218, a bundle of wire loops 218 can be used. All of these wire loops can be used to form the opening of the distal protection device. However, by forming the loop out of a bundle of thinner wires, this increases their inductance which allows a reduction in the physical size of the capacitor since less capacitance is required for the resonant LC circuit.

Figure 8:
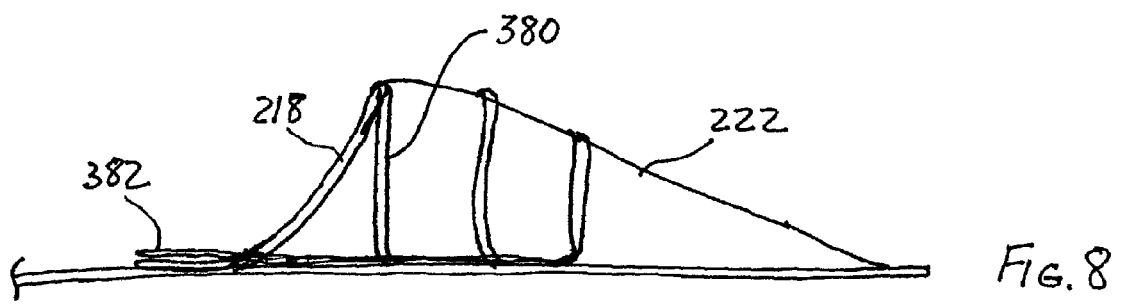
FIG. 8 is another embodiment of a coil.

Similarly, as shown in FIG. 8, instead of simply using the loop which forms the mouth of the filter as the coil, the coil can be extended. In the embodiment shown in FIG. 8, an additional wire (such as a very thin strand of spiral gold or platinum 380) is connected to, and extends the coil 218. Strand 380 spirals about the filter sac 222 and terminates with its end 382 located proximally to form one of the plates of the capacitor.

Figure 9A:
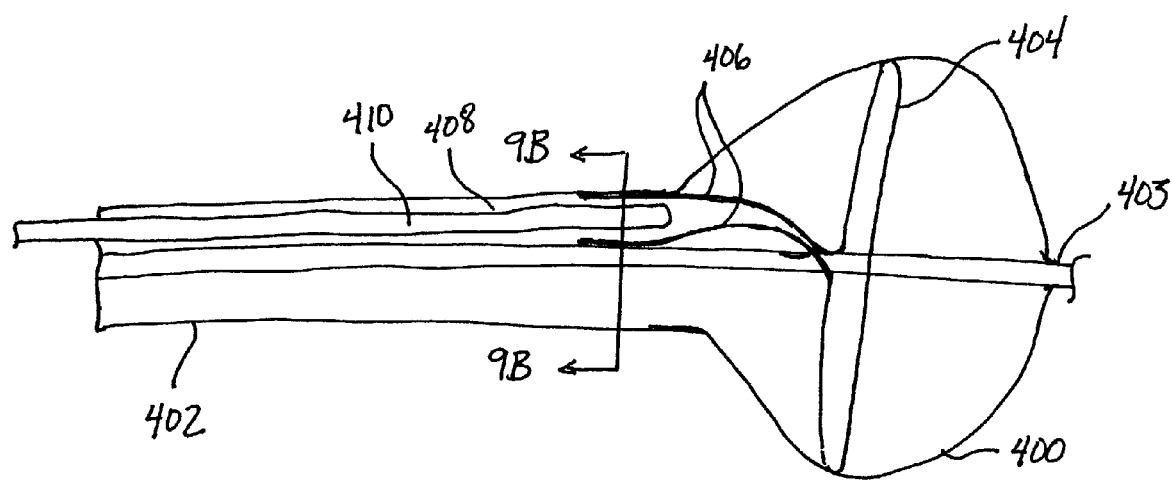
FIGS. 9A and 9B illustrate a balloon catheter, a portion of which forms an LC circuit for enhancing MRI signals.
Figure 9B:
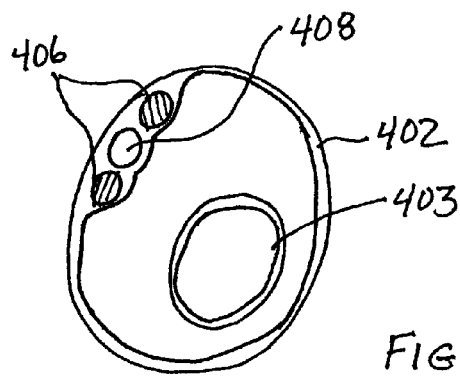

In addition, FIGS. 9A and 9B illustrate how the present invention can be implemented in a balloon device. FIG. 9A illustrates a balloon 400 formed of conventional balloon material and connected to an inflation catheter 402 having a primary inflation lumen 403 therein. A conductive coil 404 is embedded in, or attached to, the balloon material. A pair of leads 406 are connected to the ends of coil or loop 404 and extend proximally.

FIG. 9B illustrates that leads 406 are disposed closely adjacent to one another to form a capacitance therebetween. Also, a lumen 408 is positioned between leads 406. A ceramic (or other dielectric) wire 410 can thus be slidably moved within lumen 408 to change the amount of dielectric material between leads 406. This changes the capacitance developed between leads 406.

Since the coil will expand during expansion of balloon 400, the self-inductance of the coil will change. Expanding the balloon increases the self-inductance of the coil. As this happens, the physician can withdraw the ceramic wire 410 in order to reduce the capacitance associated with leads 406. Thus, the LC circuit can be continuously tuned.

Also, since the resonant frequency of the circuit depends on the coil surface, the physician is able to recognize when the balloon has obtained a certain diameter. For example, wire 410 may illustratively be connected to a scale marked on the proximal hub side of balloon catheter 402. The resonant frequency of the LC combination shown in FIGS. 9A and 9B is measured prior to implantation (such as during manufacturing) as a function of the position of wire 410 relative to the scale and the diameter of the balloon. In other words, for every balloon diameter, there is one position for wire 410 to enable a resonating frequency equal to the Larmor frequency. Thus, when the physician expands the balloon, the physician then slides wire 410 until the resonating frequency is located. The physician can then find the precise diameter of the balloon simply by looking at the position of wire 410 relative to the scale on catheter 402.

It should be noted that the present invention can also be used in an embodiment in which the tunable circuit is connected to a transmission line (such as a coaxial cable) incorporated into the structure of the guidewire (e.g., guidewire 206). A number of embodiments showing such a transmission line are set out in the patent application referred to above. Briefly, elongate conductors separated by dielectric layers and connected to a coil form an impedance matched circuit for efficient transmission of the antenna signal proximally to external processing circuitry. The conductors can be incorporated into the guidewire, a catheter or other elongate member. They can be formed by electroplating, embedding conductive material, or otherwise. Connections can be made by welding, using electrically conductive adhesive or epoxy, or in another manner. Tuning the circuit for impedance matching can be done as well.

It can thus be seen that the present invention incorporates an active LC circuit into an intravascular filter and balloon catheter for use in MRI applications. The present invention also incorporates the design of a capacitor into the functional construction of the wire connection connecting the wire loop to the guidewire or other placement device. The present invention also makes the resonant frequency selectively variable during the MRI procedure.

Although the present invention has been described with reference to preferred embodiments, workers skilled in the art will recognize that changes may be made in form and detail without departing from the spirit and scope of the invention.

What is claimed is:

1. A device for use in a body during a magnetic resonance imaging (MRI) procedure, comprising:
   an elongate member having a proximal end and a distal region;
   a single wire forming a coil coupled to the distal region of the elongate member and formed of a coil material such that the coil forms an electrical inductor;
   a capacitor having a first plate formed from a first end of the single wire and a second plate formed from a second end of the single wire; and
   a filter basket coupled to the single wire, wherein the single wire serves as a resilient loop forming a mouth for the filter basket and as a resonant coil in the MRI procedure.

2. The device of claim 1 wherein the single wire is movable between a collapsed insertion position and an expanded deployed position.

3. The device of claim 2 wherein the single wire is arranged such that the inductor and capacitor are in series with one another when the wire is in the deployed position.

4. The device of claim 3 wherein the inductor and capacitor form an LC circuit tuned to a Larmor frequency of an MRI system used for the MRI procedure.

5. The device of claim 1 wherein the first and second ends have facing sides, that face one another, the facing sides being flattened to form the plates of the capacitor.

6. The device of claim 1 and further comprising:
   a dielectric material between the plates of the capacitor.

7. The device of claim 1 wherein a resonant frequency of the capacitor and inductor is selectively variable when the single wire is in the body.

8. The device of claim 7 wherein the capacitance of the capacitor is variable when the single wire is in the body.

9. The device of claim 8 and further comprising:
   a dielectric material displaceably movable between the plates of the capacitor when the single wire is in the body to vary the capacitance of the capacitor.

10. The device of claim 1 wherein the elongate member comprises:
    a core wire attached to one of the first and second ends of the single wire.

11. The device of claim 1 wherein the formed mouth defines a proximally facing mouth of the filter basket.

12. The device of claim 1 wherein the elongate member comprises a catheter coupled to one of the first and second ends of the single wire.

13. The device of claim 12 wherein the single wire includes a pair of leads and wherein the plates of the capacitor are formed by the leads.

14. The device of claim 1 wherein the single wire forms a plurality of loops.

15. The device of claim 1 wherein the single wire comprises:
   a bundle of wires.

16. A device for use within a body during a magnetic resonance imaging (MRI) procedure, comprising:
   an elongate member;
   a single conductor forming a coil that forms an inductor coupled to a distal portion of the elongate member;
   a capacitor, having a first capacitor conductor formed from a first end of the single conductor forming the coil and a second capacitor conductor formed from a second of the single conductor forming the coil, such that the capacitor and coil form an active circuit arranged so a resonant frequency of the active circuit is selectively tunable when the active circuit is in the body; and
   a collapsible filter coupled to the single conductor forming the coil, wherein the coil serves as a resilient loop forming a mouth for the collapsible filter and serves as a resonant coil in the MRI procedure.

17. The device of claim 16 wherein the capacitor includes plates and further comprising:
   a movable dielectric member, selectively movable between the plates of the capacitor to vary a capacitance of the capacitor.

18. The device of claim 17 wherein the first and second ends of the single conductor are flattened to form the plates of the capacitor.

19. The device of claim 16 wherein the formed mouth defines a proximally facing mouth of the collapsible filter when the collapsible filter is deployed.

20. The device of claim 16 wherein the coil comprises a multi-turn coil.

21. The device of claim 16 and further comprising:
   a balloon coupled to the coil.

22. The device of claim 16 wherein the coil comprises a bundle of wires.

23. An intravascular filter, comprising:
   an elongate member;
   a filter portion coupled to the elongate member;
   a single conductor forming a coil disposed on the filter portion, wherein the coil serves as a resilient loop forming a mouth for the filter and as a resonant coil in an MRI procedure;
   a capacitor, having a first capacitor conductor formed from a first end of the single conductor forming the coil and a second capacitor conductor formed from a second end of the single conductor forming the coil; and
   wherein the single conductor forming the coil forms an inductor, and the coil and capacitor form an active circuit when the intravascular filter is deployed in a body.

24. The intravascular filter of claim 23 wherein the active circuit is selectively tunable when deployed in the body.

25. The intravascular filter of claim 23 and further comprising:
   a movable dielectric material, selectively movable between plates of the capacitor to selectively vary a capacitance of the capacitor.

26. An intravascular balloon catheter, comprising:
   an elongate member;
   a balloon coupled to the elongate member;
   a single conductor forming a coil disposed on a filter coupled to the elongate member, wherein the coil serves as a resilient loop forming a mouth for the filter and as a resonant coil in an MRI procedure;
   a capacitor, having a first capacitor conductor formed from a first end of the single conductor forming the coil and a second capacitor conductor formed from a second end of the single conductor forming the coil; and
   wherein the single conductor forming the coil forms an inductor, and the coil and capacitor form an active circuit when the balloon catheter is deployed in a body.

27. The balloon catheter of claim 26 wherein the active circuit is selectively tunable when deployed in the body.

28. The balloon catheter of claim 26 and further comprising:
   a movable dielectric material, selectively movable between plates of the capacitor to selectively vary a capacitance of the capacitor.

29. The balloon catheter of claim 28 wherein the movable dielectric material includes an elongate pusher member having a proximal end.

30. The balloon catheter of claim 29 wherein the proximal end of the elongate pusher member includes indicia indicative of an extent to which the coil is expanded.

* * * * *